US008995933B2

(12) United States Patent
Waldvogel et al.

(10) Patent No.: US 8,995,933 B2
(45) Date of Patent: Mar. 31, 2015

(54) RADIO FREQUENCY TRANSISTOR AND MATCHING CIRCUIT GROUNDING AND THERMAL MANAGEMENT APPARATUS

(71) Applicant: Motorola Solutions, Inc, Schaumburg, IL (US)

(72) Inventors: John M. Waldvogel, Libertyville, IL (US); Herman J. Miller, Algonquin, IL (US)

(73) Assignee: Motorola Solutions, Inc., Schaumburg, IL (US)

( * ) Notice: Subject to any disclaimer, the term of this patent is extended or adjusted under 35 U.S.C. 154(b) by 111 days.

(21) Appl. No.: 13/924,123

(22) Filed: Jun. 21, 2013

(65) Prior Publication Data
US 2014/0378072 A1    Dec. 25, 2014

(51) Int. Cl.
| H04B 1/38 | (2006.01) |
| H05K 7/20 | (2006.01) |
| H04B 1/40 | (2006.01) |
| H05K 3/30 | (2006.01) |

(52) U.S. Cl.
CPC ............... *H05K 7/2039* (2013.01); *H04B 1/40* (2013.01); *H05K 3/30* (2013.01)
USPC ............. 455/73; 455/253; 361/688; 361/697; 361/709; 361/736; 361/704

(58) Field of Classification Search
CPC   H05K 1/0201; H05K 2201/066; H05K 3/341
USPC ............ 455/73, 254; 361/688, 697, 709, 736, 361/704, 707, 760, 761
See application file for complete search history.

(56) References Cited

U.S. PATENT DOCUMENTS

| 5,338,971 | A | 8/1994 | Casati et al. |
| 5,442,234 | A | 8/1995 | Liang |
| 5,646,444 | A | 7/1997 | Bartlett et al. |
| 6,117,709 | A | 9/2000 | Hirose |
| 6,181,561 | B1 * | 1/2001 | Albrecht et al. .............. 361/719 |
| 6,235,991 | B1 | 5/2001 | Johnson |
| 6,347,038 | B1 | 2/2002 | Duarte et al. |
| 6,842,341 | B1 | 1/2005 | Waldvogel et al. |
| 7,009,283 | B1 | 3/2006 | deSimone et al. |
| 7,768,785 | B2 | 8/2010 | Ni et al. |
| 7,843,700 | B2 | 11/2010 | Fukuda et al. |
| 7,957,147 | B2 | 6/2011 | Ma |
| 7,983,047 | B2 | 7/2011 | Wu |
| 8,067,834 | B2 | 11/2011 | Moline |
| 2002/0048147 | A1 | 4/2002 | Miyahara et al. |
| 2006/0222301 | A1 * | 10/2006 | Oen et al. ........................ 385/88 |
| 2013/0044436 | A1 * | 2/2013 | Kovatchev et al. ........... 361/720 |

OTHER PUBLICATIONS

PCT International Search Report dated Oct. 6, 2014 for counterpart application PCT/US2014/043083.

* cited by examiner

*Primary Examiner* — Tuan Pham
(74) *Attorney, Agent, or Firm* — Steven A. May; Daniel R. Bestor

(57) ABSTRACT

In a communication device, a heat sink includes a solderable top surface with multiple upward facing swaging protrusions. A spacer is placed on top of the top surface of the heat sink with locating cut-outs on the spacer aligned with the swaging protrusions. A solder pre form is inserted into an opening in the spacer. The solder pre form includes locating features for alignment with the spacer and the swaging protrusions. The spacer is configured to restrict melted flow from the solder pre form to a defined area of the heat sink top surface. A printed circuit board including cut-outs and input and output connections for inserting a radio frequency device and further including locating holes for aligning the printed circuit board with the swaging protrusions is placed on top of the solder pre form and secured to the heat sink prior to a manufacturing process.

18 Claims, 7 Drawing Sheets

RADIO FREQUENCY TRANSISTOR AND MATCHING CIRCUIT GROUNDING AND THERMAL MANAGEMENT APPARATUS

FIELD OF THE DISCLOSURE

The present disclosure relates generally to high power amplifier applications and more particularly to a method and apparatus for assembling a grounding and thermal management apparatus for a radio frequency device and matching circuit.

BACKGROUND

Communications devices such as radios used by public safety agencies, for example, emergency first responder organizations, include one or more power amplification components, such as, radio frequency (RF) devices that transmit high power energy. The RF devices may be, for example, RF transistors connected to a printed circuit board. One of the consequences of high power transmission is a significant amount of heat is dissipated from the RF devices. This heat must be adequately managed while maintaining electrical performance. Therefore, the RF devices and the connected circuit board structure are typically attached to a heat sink with a soldering material. However, current soldering techniques do not provide a specific and repeatable dimension between an input/output lead plane and a ground flange plane in the RF device, circuit broad, and heat sink assembly. Therefore, there is no reliable platform for repeatable solder attachment of the RF device terminations in the input/output lead plane and the ground flange plane of the RF device, circuit board, and heat sink assembly.

In addition to the RF devices, other components, for example, ceramic components may also be connected to the circuit board. The reliability of the soldering material attaching these components may be affected by the heat sink assembly. Therefore, there is a need to address solder fatigue failure in power cycling by restricting the rigid attachment between the RF device/circuit board structure and the heat sink to an area away from the ceramic components and thereby reduce applied stresses on the ceramic matching component solder joints. This is important for high-power, high-duty cycle infrastructure power amplifiers that are particularly prone to solder joint fatigue failure. Furthermore, there is a need for a soldering technique that is compatible with a high-temperature lead-free solder processing which is a strict requirement for the next generation infrastructure power amplifiers.

In addition, the grounding structure for the RF device and printed circuit board assembly is important because these communications devices have an RF circuit, rather than simply a direct current (DC) circuit. Hence, it is critical to maintain good ground paths for the bottom of the circuit board, as well as, for the RF devices generating power amplification. Current grounding techniques fail to provide optimal RF grounding of the matching circuit input/output transmission lines on the RF devices and circuit broad assembly to the heat sink, i.e., where the RF grounding is as close as possible to the body of RF devices to improve electrical performance. As such, current grounding techniques fail to provide good thermal and grounding paths from the bottom of the RF transistor though the ground flange to heat sink directly below.

Furthermore, there is a need for an integrated circuit board and heat sink assembly that can be easily processed with standard surface mount technology (SMT) processing, such as solder paste stencil printing, part auto-placement and reflow soldering. There is also a need to lower processing cost with a simplified method for attaching the circuit board and heat sink assembly, thereby eliminating the need for the current specialty process capabilities being used at suppliers.

Accordingly, there is a need for an improved method and apparatus of assembling a grounding and thermal management apparatus for a radio frequency device and a matching circuit.

BRIEF DESCRIPTION OF THE FIGURES

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
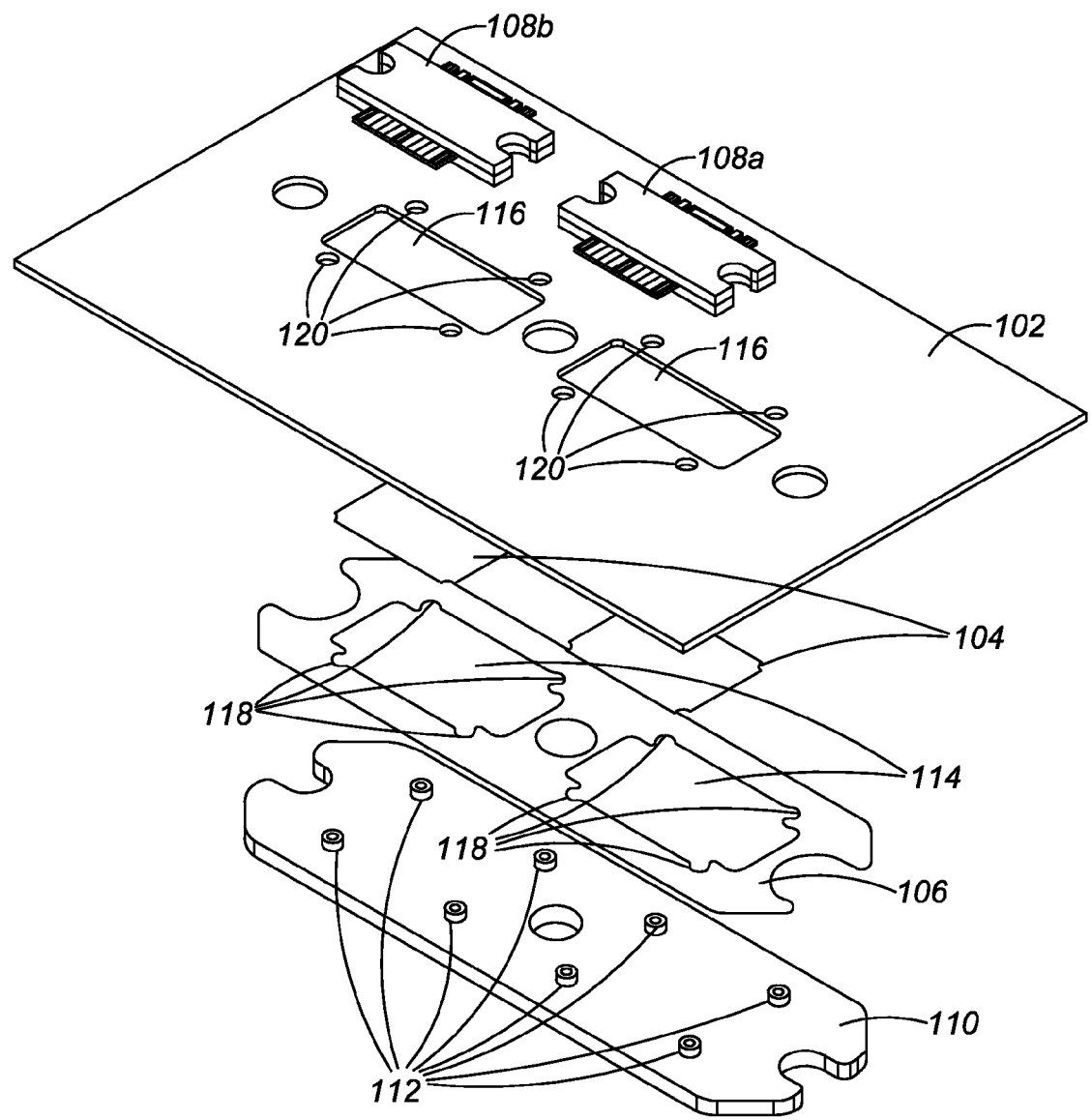
FIG. 1 is an isometric view of elements of a structure that are assembled in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

Some embodiments are directed to methods and apparatuses including a heat sink, a spacer, a solder pre form, a printed circuit board, and at least one radio frequency device configured to provide power amplification. The heat sink includes a solderable top surface with multiple upward facing swaging protrusions. The spacer is placed on top of the top surface of the heat sink with locating cut-outs on the spacer aligned with the swaging protrusions. The solder pre form is inserted into an opening in the spacer. The solder pre form includes locating features for alignment with the spacer and the swaging protrusions. The spacer is configured to restrict melted flow from the solder pre form to a defined area of the heat sink top surface. The printed circuit board includes cut-outs and input and output connections for inserting the radio frequency device and further includes locating holes for aligning the printed circuit board with the swaging protrusions. The printed circuit board is placed on top of the solder pre form and secured to the heat sink prior to a manufacturing process in which the at least one radio frequency device is placed in the printed circuit board and attached via reflow soldering.

FIG. 1 is an isometric view of elements of a structure that are assembled in accordance with some embodiments. The elements include a printed circuit board (PCB) 102, solid solder pre forms 104, a spacer 106, one or more radio frequency (RF) devices 108 (i.e., RF devices 108a and 108b), and at least one heat sink 110. PCB 102 includes cut-outs 116 and input and output connections for the RF devices 108. The solder pre forms 104 and the spacer 106 are located and clamped between the heat sink 110 and the PCB 102 during a heat sink attachment process, where the assembly is facilitated by an alignment fixture (not shown). The RF device(s) 108 may be, for example, RF transistors used for power amplification and thereby dissipate a high amount of heat that needs to be managed and put into the heat sink 110.

The heat sink 110 (also referred to herein as a heat spreader 110 or a coin 110) is a mostly flat component, constructed of a high electrically and thermally conductive material, for example, malleable copper. At least the top surface of heat spreader 110 is solderable and includes multiple integral swaging protrusions 112. The protrusion may be, for example, hollow cylindrical objects. The surface of the heat spreader 110 may be made solderable using a suitable plating process. Heat dissipated from the RF device(s) 108, which during subsequent surface mount technology assembly is inserted into the cut-outs 116 of PCB 102 and reflow soldered to heat spreader 110, is transferred from the RF device(s) 108 to the heat spreader 110, allowing for thermal management.

The spacer 106 (also referred to as a shim 106) is a structure with multiple apertures including, solid solder pre form openings 114 and locating cut outs 118. The spacer 106 is constructed of a solder non-wetting material, for example, PCB laminate or stainless steel of uniform thickness and good dimensional stability. During assembly, the spacer 106 is placed on top of the heat sink 110 with the locating cut outs 118 on the spacer 106 aligned with the swaging protrusions 112 of the heat sink 110. The locating cut outs 118 of the spacer 106 therefore lend the spacer 106 to low cost manufacturing. In addition, the spacer 106 allows a designer of the structure 100 to set a particular height dimension for the structure 100.

The relatively thin solid solder pre forms 104 include locating features so that the solder pre forms 104 can be properly aligned within the solder pre form openings 114 of the spacer 106 and located using the swaging protrusions 112 of the heat sink 110. The solder pre forms 104 thickness may be the same as or slightly less than that of the spacer 106. In some embodiments, the solder pre forms 104 are slightly smaller than the solder pre form openings 114, but it are larger than the cut-outs 116 in the PCB 102 for the RF device(s) 108. This allows the spacer 106 to restrict the flow of molten solder from the pre forms 104 during a reflow soldering process to defined areas of the heat sink 110 surface and forces the solder attachment to occur in a clearly defined area, i.e., the area defined by the solder pre form openings 114.

The bottom of the PCB 102 is a ground plane. The ground of the PCB 102 and the RF devices 108 are linked together when the RF devices 108 are inserted into the cut-outs 116 of the PCB 102. Once the structure 100 goes through a reflow solder process, the solder pre forms 104 will melt and will attach the PCB 102 with the attached RF devices 108 to the heat spreader 110, thereby attaching the ground plane of the PCB 102 to the heat spreader 110. This will maintain the thermal management path from the RF devices 108 to the heat spreader 110 and provides a good quality ground from the RF device 108 to the heat spreader 110 and from the PCB 102 to the heat spreader 110.

During assembly of the structure 100, the heat sink 110 is placed with the protrusions 112 facing upwards. The spacer 106 is placed over the heat sink 110 and the locating cut outs 118 on the spacer 106 aligned with the swaging protrusions 112 of the heat sink 110. The solder pre forms 104 are then placed on the solder pre form openings 114 of the spacer 106, wherein locating features on the solder pre form 104 are also aligned with the swaging protrusions 112 of the heat sink 110. PCB 102 is placed on top of the solder pre forms 104, spacer 106 and heat sink 110 assembly, with the ground plane side of the PCB 102 oriented downward. Locating holes 120 in the PCB properly align the PCB 102 with the heat sink protrusions 112. The locating features 120 in the PCB 102, the locating features in the solder pre forms 104, and the locating cut outs 118 in the spacer 106 ensure the cut-outs 116 in the PCB 102 are properly located with respect to the solder pre forms. That is, each solder pre form 104 spans the cut-outs 116 for the RF devices 108 and extends under the PCB ground plane in close proximity to the eventual placement of an RF device.

During assembly, the PCB 102 is clamped down on the solder pre forms 104, spacer 106 and heat sink 110 assembly using, for example, a simple fixture. The heat sink attachment is affected by forcibly inserting a swaging tool in the hollow swaging protrusions 112. This process forces the cylindrical protrusion material outward against the walls of the PCB locating holes 120, forming a secure attachment which easily withstands lead-free solder reflow processing. The heights of the swaging protrusions 112 are optimized such that the resulting attachment feature is entirely sub-flush to the top of the PCB surface, thus permitting subsequent surface mount technology (SMT) processing, for example, solder paste stencil printing and part placement. After swaging, the structure 100 is integrated such that it can be handled. For example, the structure 100 can be assembled at a PCB fabricator and shipped to an SMT production line for part population and reflow. The alignment and swaging processes do not require special capabilities and can be easily completed using simple tools.

The uniform thickness of the spacer 106 creates repeatable dimension from the top of the heat sink to the top of the PCB 102, a dimension which can be adjusted easily for multiple applications by adjusting the spacer thickness. Control of this dimension is critical to maintaining high PCB SMT production yields; i.e., insuring that the RF devices 108 leads and bottom ground flange are all sufficiently soldered. The solder pre form openings 114, the solder non-wetting nature of the spacer 106, and the fact that the spacer is clamped between the heat sink and the PCB ground plane deliver a repeatable means to produce an optimal electrical attachment of the RF transistor input/output transmission line ground plane to the heat sink. When the assembled structure 100 passes through a reflow oven, the solder pre forms 104 melt and simultaneously forms solder connections between the RF transistor 108 ground flange and the heat sink 110, as well as the matching circuit PCB ground plane and the heat sink. The spacer opening geometry and non-wetting nature performs as a solder mask to restrict the solder attachment to the optimal area adjacent to the RF transistor.

Figure 2:
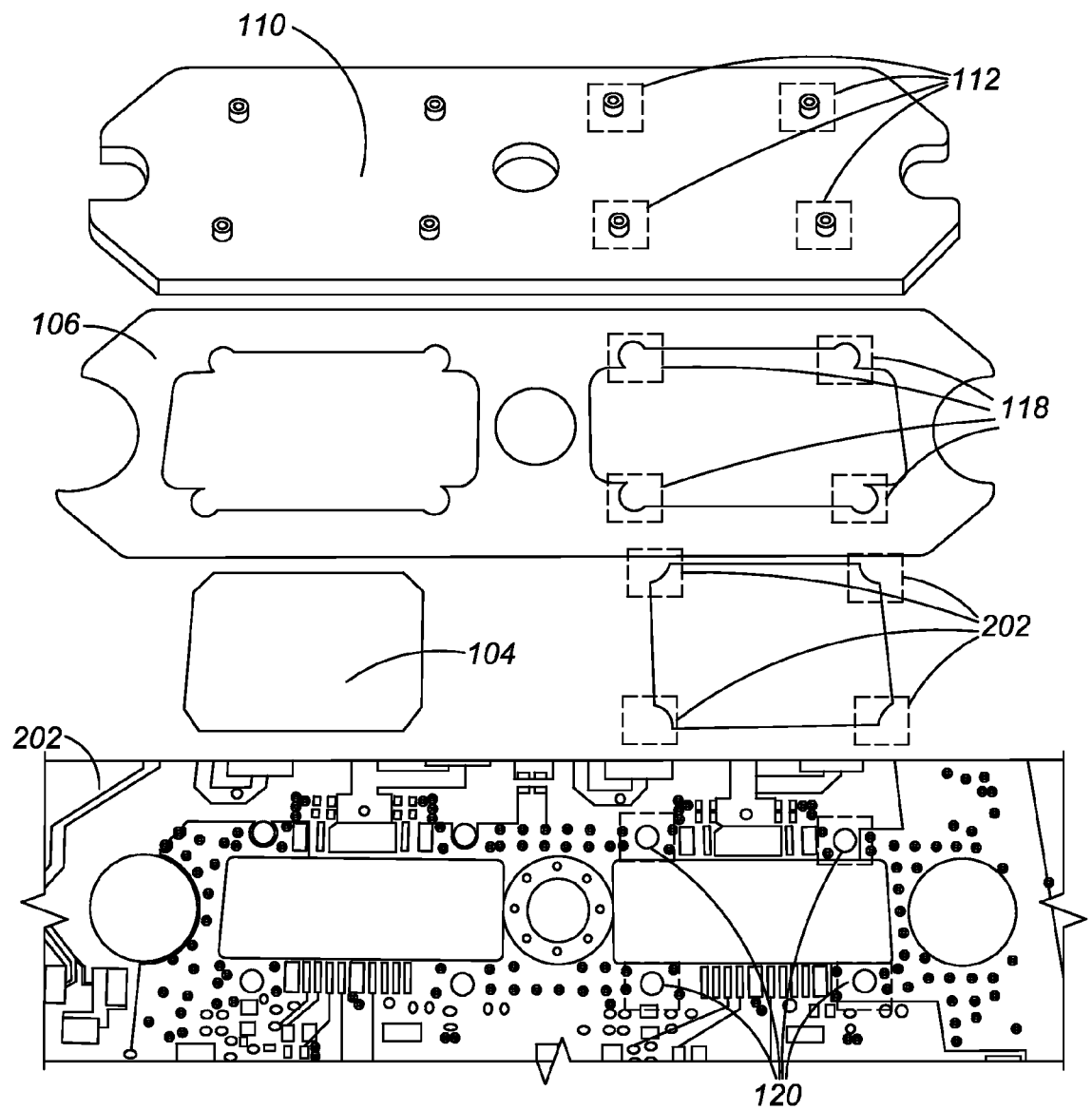
FIG. 2 is a diagram of the alignment components of the structure in accordance with some embodiments.

FIG. 2 is a diagram of the alignment components of the structure in accordance with some embodiments. FIG. 2 shows the swaging protrusions 112 of the heat sink 110, locating cut outs 118 on the spacer 106 that aligned with the swaging protrusions 112 of the heat sink 110, locations 202 on a solder pre form 104 that align the solder pre form 104 with the locating cut outs 118 on the spacer 106, and locating holes 120 on the PCB 102 that align with the swaging protrusions 112 of the heat sink 110. The locating cut outs 118 on the spacer 106 help to define an area where the solder pre form 104 is to be placed. Solderable pads on the top of the PCB 102 align with the input/output of the RF devices.

Figure 3:
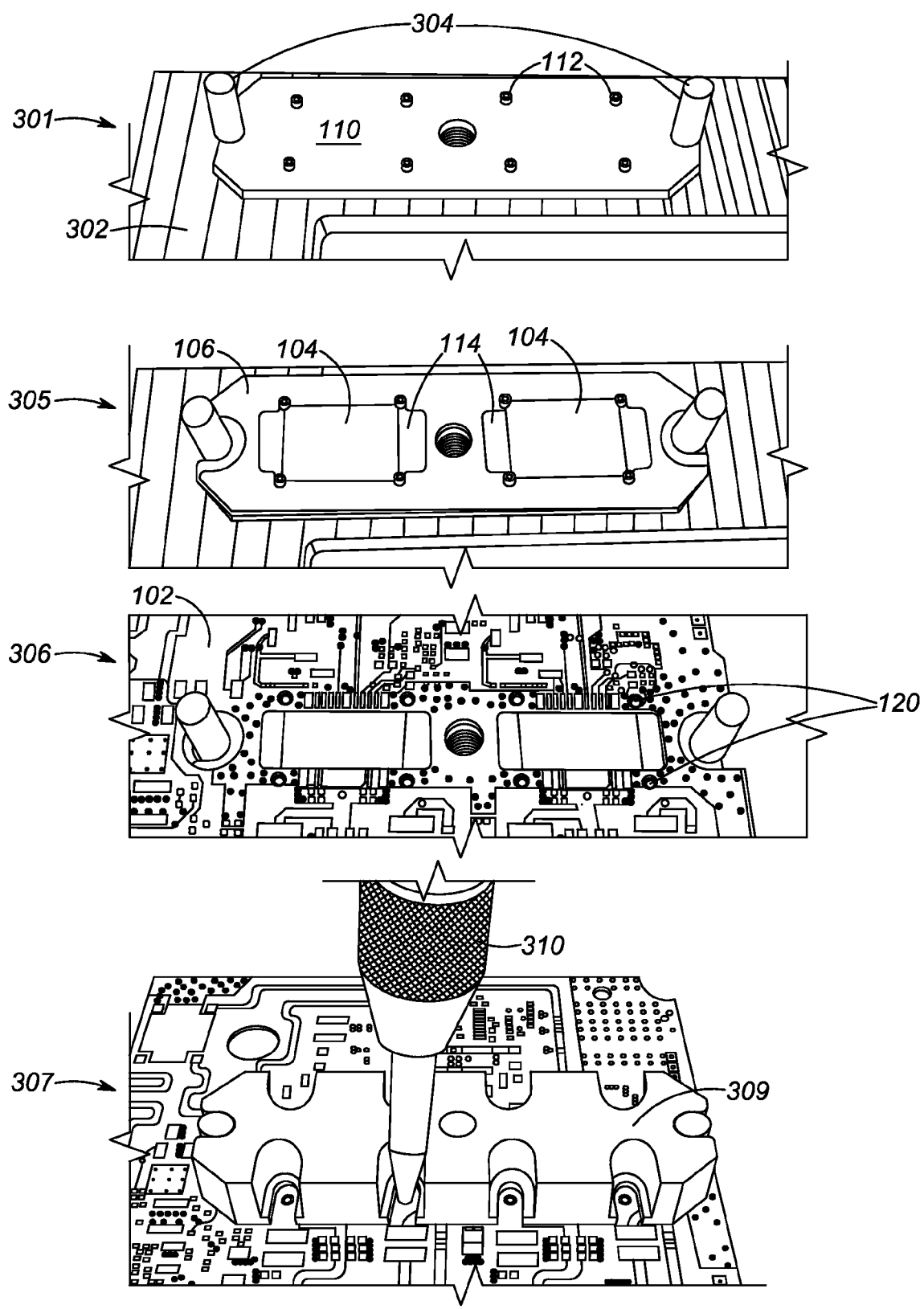
FIG. 3 is a diagram of heat sink attachment assembly steps used in accordance with some embodiments.

FIG. 3 is a diagram of heat sink assembly steps used in accordance with some embodiments. In step 301, the heat sink 110 is placed on a fixture/assembly template 302, with the swaging protrusions 112 facing upwards. The fixture template 302 includes alignment pins 304 to hold the heat sink 112 stationary on the fixture template 302. In step 305, the spacer 106 is placed on top of the heat sink 110, using the swaging protrusions 112 as an alignment guide and the solder pre-forms 104 are placed in the solid solder pre form openings 114 in the spacer 106, using the protrusion 112 for alignment. In step 306, the PCB 102 is place on top of the assembly, where the locating holes 120 on the PCB 102 are aligned with the swaging protrusion 112. The swaging protrusions 112 fit loosely through locating holes 120 on the PCB 102. In step 307, an assembly clamp 309 is used to hold the PCB 102 tightly with the heat sink 110 and a swaging tool 310 is used to force the swaging protrusion 112 out radially so that the PCB 102 is permanently attached to the heat sink 110, creating a circuit board assembly that can withstand a manufacturing/solder melting process with the components held in place tightly without a need for extra fixturing.

The swaging protrusions 112 do not extend above the PCB 102 because the swaging protrusions are designed to be relatively short to fit below the top of the PCB 102 surface but strong enough to hold the assembly together during the manufacturing process. This allows the structure to be planar and suitable for SMT manufacturing. It should be noted that other materials such as screws or adhesives may be used to hold the assembly together although any material that extends above the surface of the PCB 102 may complicate the manufacturing process.

Figure 4:
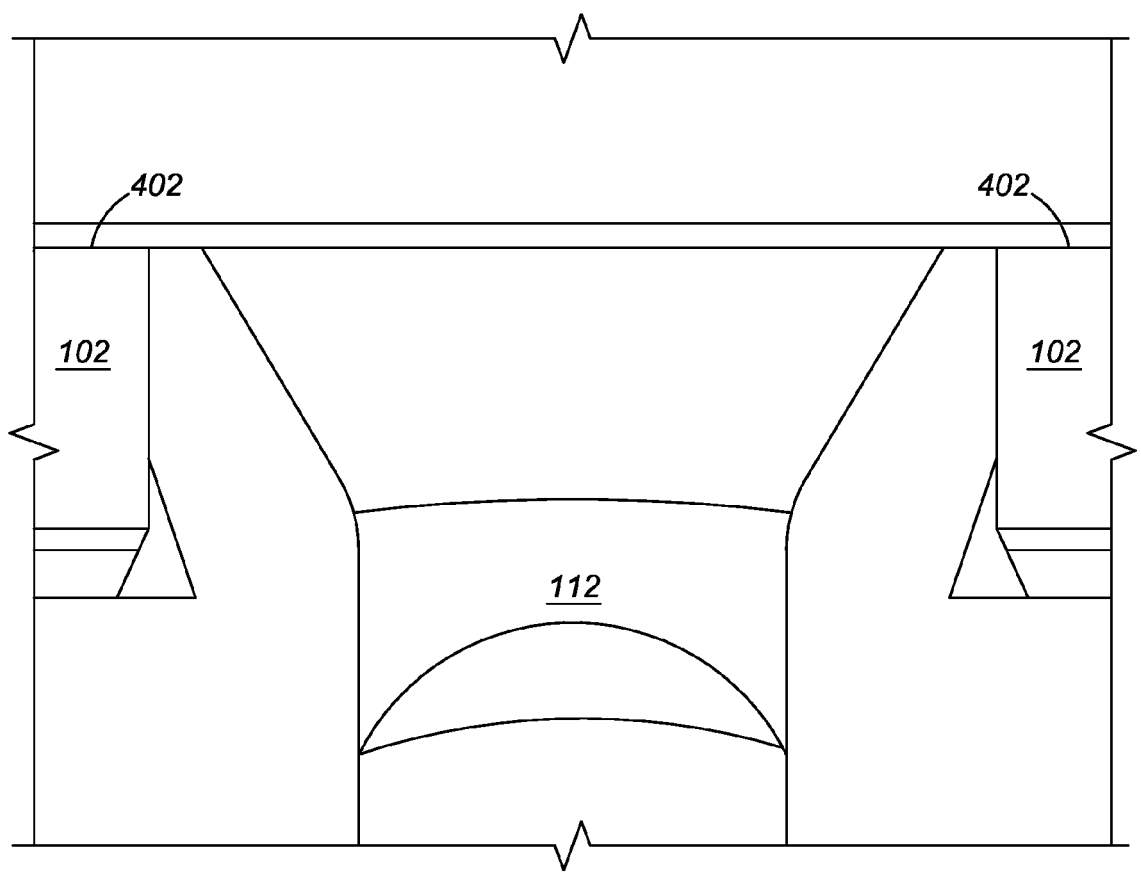
FIG. 4 is a diagram of a cross section of a protrusion after it has been swaged in accordance with some embodiments.

FIG. 4 is a diagram of a cross section of a protrusion 112 after it has been swaged in accordance with some embodiments. When the PCB 102 is clamped to the assembly, the protrusion 112 is forced outward to come in contact with the PCB 102, but does not extend above the surface 402 of the PCB 102.

Figure 5:
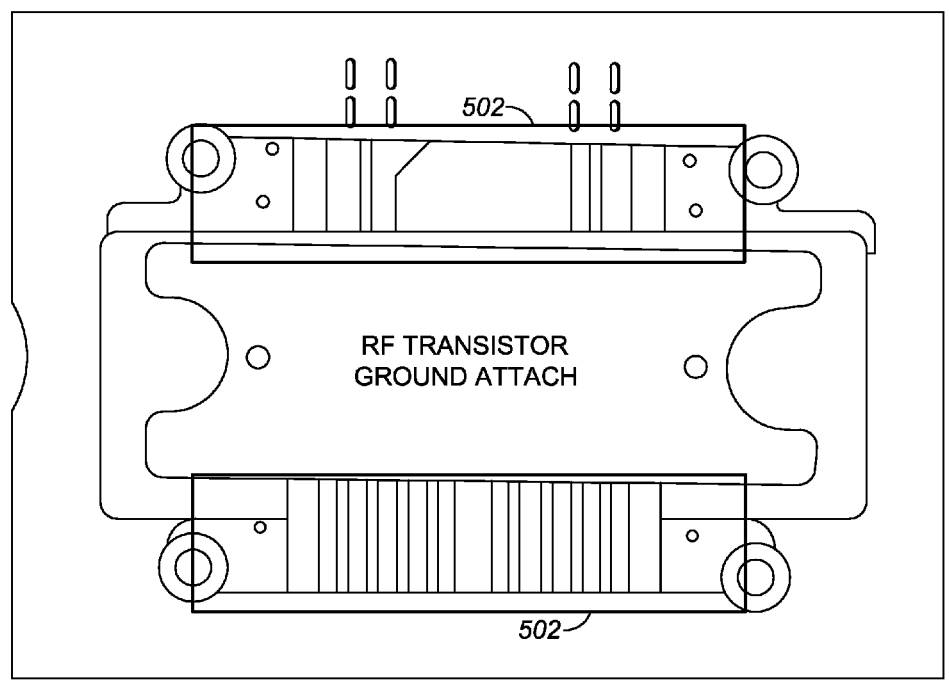
FIG. 5 is an diagram of a structure assembled after a reflow solder process in accordance with some embodiments.

FIG. 5 is a diagram of a structure assembled after a reflow solder process in accordance with some embodiments. Blocks 502 shows areas where the solder pre form 104 melted during the manufacturing process. The areas shown by blocks 502 have a superior ground attachment between the top of the heat sink 110 and bottom of the PCB 102 and RF device 108. During reflow soldering, the spacer 106 restricted the flow of the solder, as defined by the areas shown in blocks 502 so that the RF ground attachment is focused where it is needed, i.e., close to the RF transistor as shown by the area labeled "RF transistor ground attach." The solder pre form is prevented from spreading outside the region where it is needed so that other components on the PCB that do not need the rigid solder attachment remain reliable. The assembled structure therefore allows for excellent RF grounding, good thermal management and preserves the reliability of the structure by not having the solder attachment where it is not needed. The disclosed assembly is compatible with processing of lead free solder.

Figure 6:
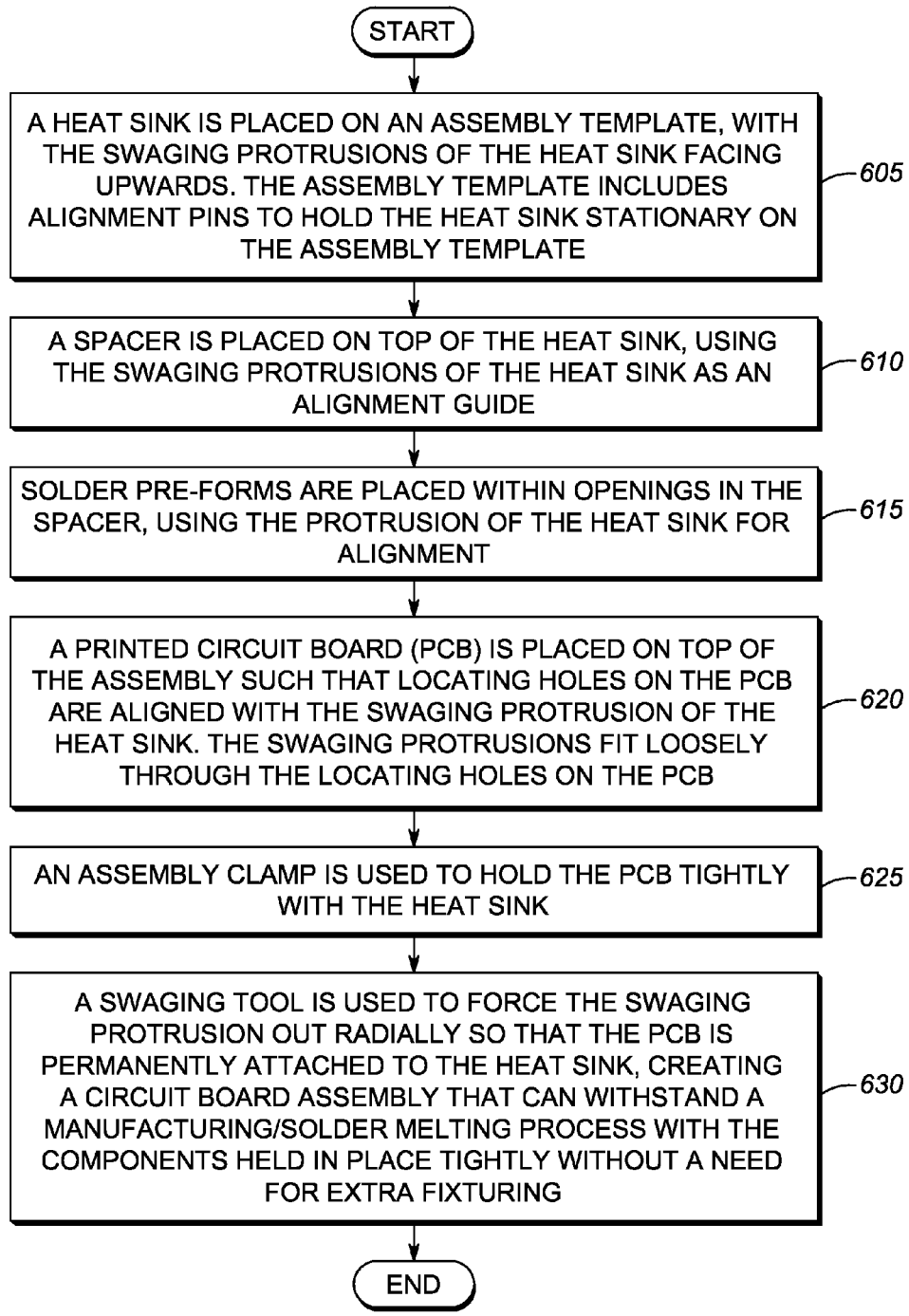
FIG. 6 is a flow diagram of the steps implemented in accordance with some embodiments.

FIG. 6 is a flow diagram of the steps implemented in accordance with some embodiments. At step 605, a heat sink, such as heat sink 110, is placed on an assembly template, with the swaging protrusions, such as protrusions 112, of the heat sink facing upwards. The assembly template includes alignment pins to hold the heat sink stationary on the assembly template. In step 610, a spacer, such as spacer 106, is placed on top of the heat sink, using the swaging protrusions of the heat sink as an alignment guide. At step 615, solder preforms, such as solder pre forms 104, are placed within openings in the spacer, using the protrusion of the heat sink for alignment. At step 620, a PCB, such as PCB 102, is placed on top of the assembly such that locating holes on the PCB are aligned with the swaging protrusion of the heat sink. The swaging protrusions fit loosely through the locating holes, such as locating holes 120, on the PCB. At step 625, an assembly clamp is used to hold the PCB tightly with the heat sink. At step 630, a swaging tool is used to force the swaging protrusion out radially so that the PCB is permanently attached to the heat sink, creating a circuit board assembly that can withstand a manufacturing/solder melting process with the components held in place tightly without a need for extra fixturing.

Figure 7:
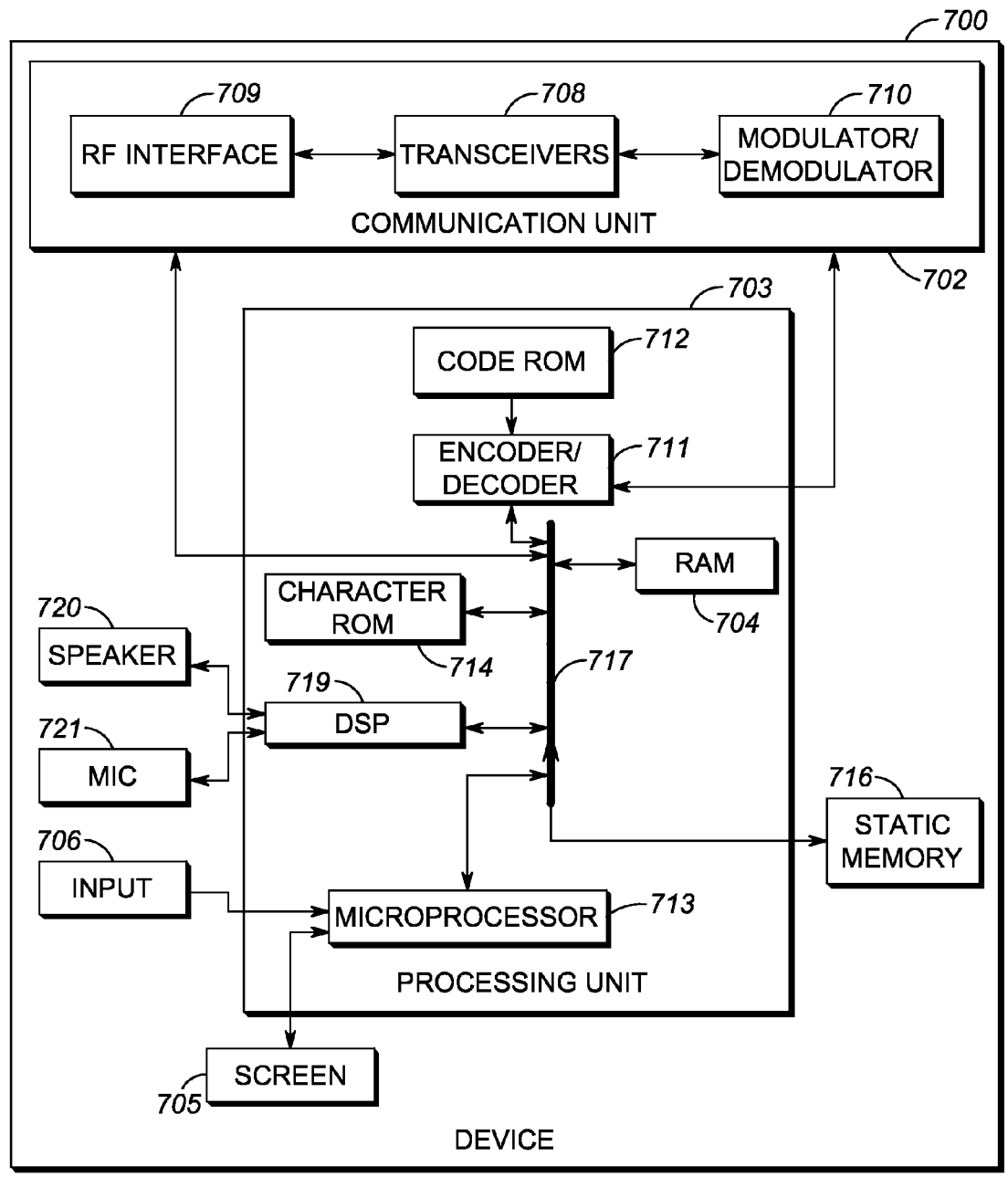
FIG. 7 is a block diagram of an apparatus configured to use the assembled structure in accordance with some embodiments.

FIG. 7 is a block diagram of a communication device 700 that is configured to use the assembled structure in accordance with some embodiments. The communication device may be, for example, a cell phone, a smart phone, a mobile radio, a base station, an access point, or any other communication device configured to incorporate an RF device inserted into a PCB. The communication device includes a communications unit 702 coupled to a common data and address bus 717 of a processing unit 703. The communication device may also include an input unit (e.g., keypad, pointing device, etc.) 706, an output transducer unit (e.g., speaker) 720, an input transducer unit (e.g., a microphone) (MIC) 721, and a display screen 705, each coupled to be in communication with the processing unit 703.

The processing unit 703 may include an encoder/decoder 711 with an associated code ROM 712 for storing data for encoding and decoding voice, data, control, or other signals that may be transmitted or received by the communication device. The processing unit 703 may further include a microprocessor 713 coupled, by the common data and address bus 717, to the encoder/decoder 711, a character ROM 714, a RAM 704, and a static memory 716. The processing unit 703 may also include a digital signal processor (DSP) 719, coupled to the speaker 720, the microphone 721, and the common data and address bus 717, for operating on audio signals received from one or more of the communications unit 702, the static memory 716, and the microphone 721.

The communications unit 702 may include an RF interface 709 configurable to communicate with network components, and other user equipment within its communication range. The communications unit 702 may include one or more broadband and/or narrowband transceivers 708, such as an Long Term Evolution (LTE) transceiver, a Third Generation (3G) (3GGP or 3GGP2) transceiver, an Association of Public Safety Communication Officials (APCO) Project 25 (P25) transceiver, a Digital Mobile Radio (DMR) transceiver, a Terrestrial Trunked Radio (TETRA) transceiver, a WiMAX transceiver perhaps operating in accordance with an IEEE 802.16 standard, and/or other similar type of wireless transceiver configurable to communicate via a wireless network for infrastructure communications. The communications unit 702 may include one or more local area network or personal area network transceivers such as Wi-Fi transceiver perhaps operating in accordance with an IEEE 802.11 standard (e.g., 802.11a, 802.11b, 802.11g), or a Bluetooth transceiver, for subscriber device to subscriber device communications. The transceivers may be configured to include the assembly described in FIGS. 1, 3 and 6 and may be coupled to a combined modulator/demodulator 710 that is coupled to the encoder/decoder 711. The character ROM 714 stores code for decoding or encoding data such as control, request, or instruction messages, channel change messages, and/or data or voice messages that may be transmitted or received by the communication device. Static memory 716 may store operating code associated with operating the communication device.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 20%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. An apparatus comprising,
a heat sink including a solderable top surface with multiple upward facing swaging protrusions;
a spacer placed on top of the top surface of the heat sink with locating cut-outs on the spacer aligned with the swaging protrusions;
a solder pre form inserted into an opening in the spacer, the solder pre form including locating features for alignment with the spacer and the swaging protrusions, the spacer being configured to restrict melted flow from the solder pre form to a defined area of the heat sink top surface; and
a printed circuit board including cut-outs and input and output connections for inserting at least one radio frequency device configured to provide power amplification and further including locating holes for aligning the printed circuit board with the swaging protrusions, the printed circuit board being placed on top of the solder pre form and secured to the heat sink prior to a manufacturing process in which the radio frequency device is attached.

2. The apparatus of claim 1, wherein the heat sink is attached to the printed circuit board and the radio frequency device attachment by inserting a swaging tool in the swaging protrusions, thereby forcing a protrusion material outward against walls of the locating holes in the printed circuit board and beneath a top surface of the printed circuit board.

3. The apparatus of claim 1, wherein the locating holes in the printed circuit board, the locating cut-outs in the spacer and the locating features in the solder pre form ensure that the cut-outs in the printed circuit board are properly located with respect to the solder pre form.

4. The apparatus of claim 1, wherein the bottom of the printed circuit board is a ground plane, wherein the ground of the printed circuit board and the ground of the at least one attached radio frequency device are linked together when the at least one radio frequency device is inserted into the cut-outs of the printed circuit board.

5. The apparatus of claim 1, wherein the solder pre form is configured to melt during the manufacturing process and attach the printed circuit board and the radio frequency device to the heat sink, wherein the solder pre form attaches a ground plane of the printed circuit board to the heat sink.

6. The apparatus of claim 1, wherein the solder pre form is smaller than the opening in the spacer and the solder pre form is of a thickness the same as or less than the thickness of the spacer.

7. The apparatus of claim 1, wherein heat dissipated from the at least one radio frequency device is transferred to the heat sink.

8. The apparatus of claim 1, wherein the spacer is constructed of a solder non-wetting material of a uniform thickness.

9. The apparatus of claim 1, wherein the swaging protrusions are cylindrical objects.

10. The apparatus of claim 1, wherein the heat sink is constructed with an electrically and thermally conductive material.

11. A method comprising,
placing a heat sink including a solderable top surface with multiple upward facing swaging protrusions on a fixture;

locating a spacer on top of the top surface of the heat sink with locating cut-outs on the spacer aligned with the swaging protrusions;

inserting a solder pre form into an opening in the spacer, the solder pre form including locating features for alignment with the spacer and the swaging protrusions, the spacer being configured to restrict melted flow from the solder pre form to a defined area of the heat sink top surface;

placing a printed circuit board on top of the solder pre form, the printed circuit board including cut-outs and input and output connections for at least one radio frequency device configured to provide power amplification and further including locating holes for aligning the printed circuit board with the swaging protrusions; and securing the printed circuit board to the heat sink prior to a manufacturing process.

12. The method of claim 11, wherein the securing comprises attaching the heat sink to the printed circuit board by inserting a swaging tool in the swaging protrusions, thereby forcing a protrusion material outward against walls of the locating holes in the printed circuit board and beneath a top surface of the printed circuit board.

13. The method of claim 11, further comprising linking a ground plane of the printed circuit board and the ground of the at least one radio frequency device together when the at least one radio frequency device is inserted into the cut-outs of the printed circuit board.

14. The method of claim 11, further comprising melting the solder pre form during the manufacturing process and attaching the printed circuit board including the at least one inserted radio frequency device to the heat sink with the melted solder pre form, wherein the melted solder pre form attaches a ground plane of the printed circuit board to the heat sink.

15. The method of claim 11, wherein the spacer is constructed of a solder non-wetting material of a uniform thickness.

16. The method of claim 11, wherein the swaging protrusions are cylindrical objects.

17. The method of claim 11, wherein the heat sink is constructed with an electrically and thermally conductive material.

18. A communication device comprising, a communication unit including a transceiver configured to perform radio frequency transmission;

a processor configured to process voice, data, control, or other signals transmitted to or received by the communication device, and a memory configured to store operating code associated with operating the communication device, the transceiver including a heat sink including a solderable top surface with multiple upward facing swaging protrusions, a spacer placed on top of the top surface of the heat sink with locating cut-outs on the spacer aligned with the swaging protrusions, a solder pre form inserted into an opening in the spacer, the solder pre form including locating features for alignment with the spacer and the swaging protrusions, the spacer being configured to restrict melted flow from the solder pre form to a defined area of the heat sink top surface, and a printed circuit board including cut-outs and input and output connections for inserting at least one radio frequency device configured to provide power amplification and further including locating holes for aligning the printed circuit board with the swaging protrusions, the printed circuit board being placed on top of the solder pre form and secured to the heat sink prior to a manufacturing process in which the radio frequency device is attached.

\* \* \* \* \*